(12) United States Patent
Furuie

(10) Patent No.: US 9,356,075 B2
(45) Date of Patent: May 31, 2016

(54) ORGANIC EL DISPLAY DEVICE

(71) Applicant: Japan Display Inc., Tokyo (JP)

(72) Inventor: Masamitsu Furuie, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 14/561,249

(22) Filed: Dec. 5, 2014

(65) Prior Publication Data

US 2015/0162386 A1    Jun. 11, 2015

(30) Foreign Application Priority Data

Dec. 5, 2013  (JP) ................................. 2013-251938

(51) Int. Cl.
*H01L 27/32* (2006.01)
*H01L 51/52* (2006.01)

(52) U.S. Cl.
CPC .......... *H01L 27/322* (2013.01); *H01L 27/3213* (2013.01); *H01L 27/3244* (2013.01); *H01L 51/525* (2013.01)

(58) Field of Classification Search
CPC .............. H01L 27/322; H01L 27/3213; H01L 27/3244
See application file for complete search history.

(56) References Cited

U.S. PATENT DOCUMENTS

| 2005/0151462 A1 | 7/2005 | Miyagawa |
| 2009/0033845 A1 | 2/2009 | Tanno et al. |
| 2013/0001620 A1* | 1/2013 | Sugisawa ............ H01L 27/3276 257/98 |

FOREIGN PATENT DOCUMENTS

| JP | 4409589 B2 | 2/2010 |
| JP | 4610315 B2 | 1/2011 |

* cited by examiner

*Primary Examiner* — David Vu
(74) *Attorney, Agent, or Firm* — Typha IP LLC

(57) ABSTRACT

An organic EL display device includes a thin film transistor substrate in which a light-emitting element is provided for each of plural sub-pixels constituting each pixel, a counter substrate provided with a coupled color filter which is a color filter arranged to be extended over plural adjacent sub-pixels and allowing light in one wavelength region to pass through and a light-shielding film which is arranged on a boundary between adjacent color filters to allow lights in different wavelength regions to pass through and shields light, a filler arranged between the thin film transistor substrate and the counter substrate and made of a transparent organic material, and a filler thickness adjustment part which adjusts to cause a thickness of the filler in a region where the light-shielding film is provided to be thinner than a thickness of the filler in a region where the light-emitting element is provided.

6 Claims, 10 Drawing Sheets

ORGANIC EL DISPLAY DEVICE

CROSS-REFERENCE TO RELATED APPLICATION

The present application claims priority from Japanese application JP2013-251938 filed on Dec. 5, 2013, the content of which is hereby incorporated by reference into this application.

BACKGROUND OF THE INVENTION

1. Field of the Invention

The present invention relates to an organic EL (Electro-Luminescent) display device.

2. Description of the Related Art

In recent years, an image display device (hereinafter referred to as an organic EL display device) using a self-luminous body called an organic light emitting diode is put in practical use. As compared with a related art liquid crystal display device, since the self-luminous body is used, this organic EL display device is excellent in visibility and response speed, and moreover, further thinning is possible since an assistant illumination device such as a backlight is not required.

In the organic EL display device, as the organic EL display device for performing color display, there is known one in which a light-emitting element emits light of one of three colors of R (Red), G (Green) and B (Blue) for each pixel, one in which a light-emitting element emits white light and a color filter of each pixel allows light in a wavelength region of one of RGB three colors to pass through, or one in which these two systems are combined.

Japanese Patent No. 4409589 discloses a liquid crystal display device in which sub-pixels of the same color of at least one of three colors are adjacent to each other, the two adjacent sub-pixels of the same color share a color filter, and a pixel electrode of one of the two sub-pixels is extended over a pixel boundary and is disposed also in the pixel of the other of the two sub-pixels. Japanese Patent No. 4610315 relates to an organic EL display device in which lights of three colors of RGB are respectively emitted and discloses a pixel structure in which light-emitting elements of the same color are formed to be adjacent to each other.

SUMMARY OF THE INVENTION

In an organic EL display device to emit lights of plural colors by using color filters, since an organic layer including a light-emitting layer to emit light of a single color such as W (White) color can be formed on the whole surface of a display region, an evaporation mask is not required in film growth of the light-emitting layer. Accordingly, there is a merit that high definition pixels each of which has a large light-emitting area can be manufactured. However, since a transparent resin or the like is sandwiched and adhered between a TFT (Thin Film Transistor) substrate and a counter substrate on which color filters are formed, there is a distance between the TFT substrate and the counter substrate, and there is a fear that so-called color mixture occurs in which light emitted from the light-emitting layer in an oblique direction or a lateral direction is emitted through a color filter of an adjacent pixel.

On the other hand, a lattice-shaped light-shielding film called a black matrix to shield light emitted in an oblique direction is provided on the boundary of pixels, and the color mixture can be suppressed by widening the line width of the black matrix. However, in this method, since the numerical aperture is reduced, and the light-emitting efficiency is reduced. Besides, it is conceivable that the color mixture is suppressed by reducing the distance between the light-emitting layer and the color filter or the black matrix. However, if the distance is reduced, it is conceivable that the light-emitting element is damaged by a foreign substance adhered between them and the defective rate of products becomes high.

The invention is made in view of the above circumferences and has an object to provide an organic EL display device in which reduction of light-emitting efficiency is suppressed and optical color mixture is suppressed.

According to the invention, an organic EL display device includes a thin film transistor substrate in which a light-emitting element is formed for each of plural sub-pixels constituting each pixel on a transparent insulation substrate, a counter substrate provided with, on a transparent insulation substrate, a coupled color filter which is a color filter arranged to be extended over plural adjacent sub-pixels and allowing light in one wavelength region to pass through and a light-shielding film which is arranged on a boundary between adjacent color filters to allow lights in different wavelength regions to pass through and shields light, a filler arranged between the thin film transistor substrate and the counter substrate and made of a transparent organic material, and a filler thickness adjustment part which adjusts to cause a thickness of the filler in a region where the light-shielding film is formed to be thinner than a thickness of the filler in a region where the light-emitting element is provided.

Besides, in the organic EL display device of the invention, the filler thickness adjustment part may be a columnar spacer arranged in the filler.

Besides, in the organic EL display device of the invention, the filler thickness adjustment part may be a film provided on the counter substrate and provided on the boundary between the adjacent color filters to allow the lights in the different wavelength regions.

Besides, in the organic EL display device of the invention, the plural adjacent sub-pixels for which the coupled color filter is provided may be four sub-pixels sharing one corner part.

Besides, in the organic EL display device of the invention, the sub-pixel may emit light of one of R (Red), G (Green), B (Blue) and W (White) and four sub-pixels to emit lights of R (Red), G (Green), B (Blue) and W (White) may constitute one pixel.

DETAILED DESCRIPTION OF THE INVENTION

Figure 1:
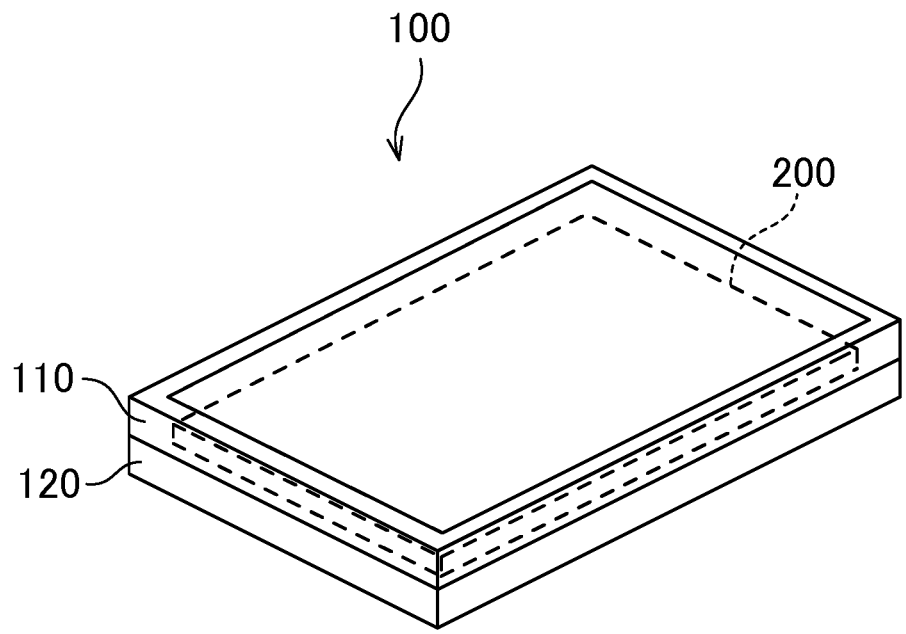
FIG. 1 is a view schematically showing an organic EL display device of an embodiment.

Hereinafter, embodiments of the invention will be described with reference to the drawings. Incidentally, in the drawings, the same or equivalent elements are denoted by the same reference numerals and the duplicate description thereof is omitted.

FIG. 1 schematically shows an organic EL display device 100 of an embodiment. As shown in this drawing, the organic EL display device 100 includes an organic EL panel 200 fixed so as to be sandwiched between an upper frame 110 and a lower frame 120.

Figure 2:
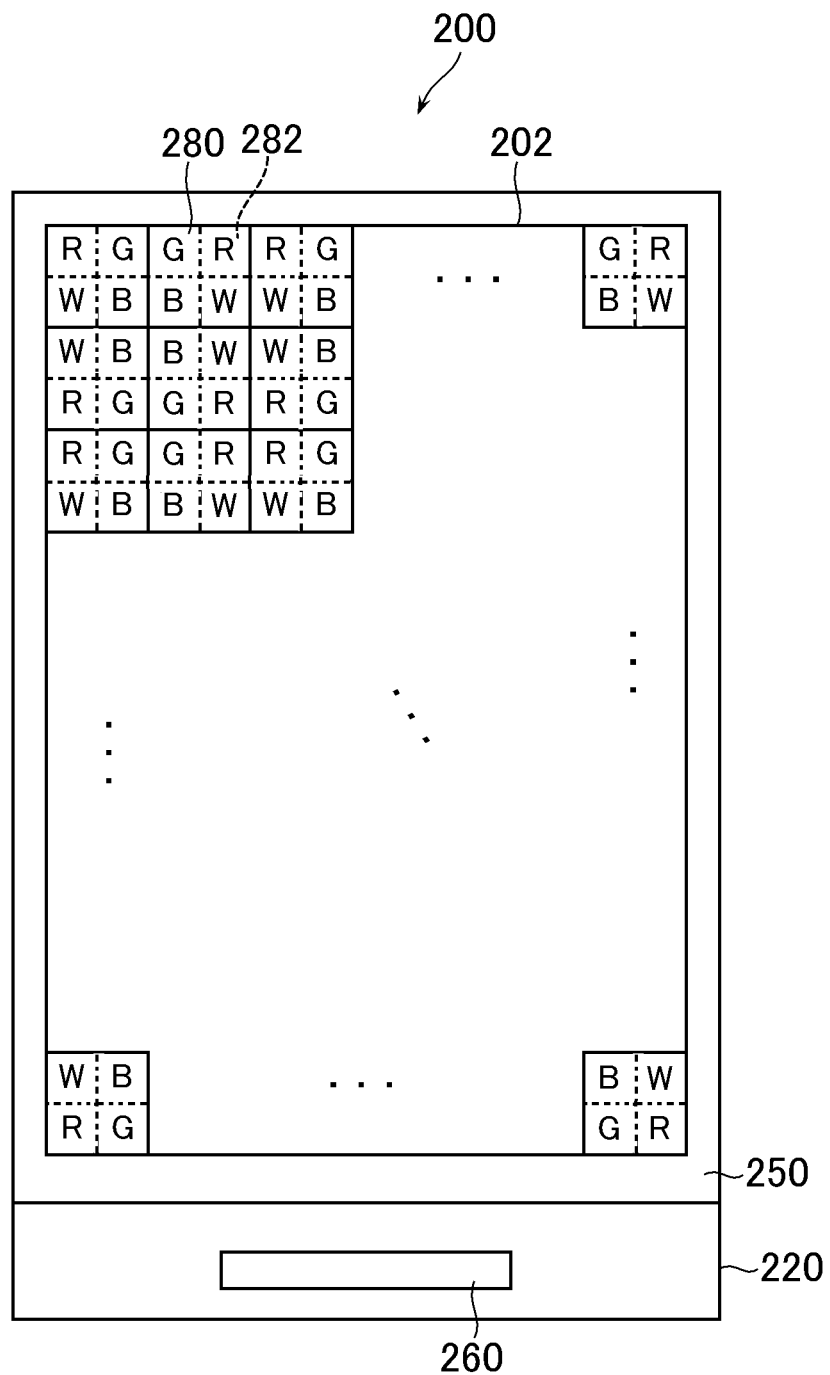
FIG. 2 is a view showing a structure of the organic EL display device of FIG. 1.

FIG. 2 shows a structure of the organic EL panel 200 of FIG. 1. The organic EL panel 200 includes two substrates of a TFT (Thin Film Transistor) substrate 220 and a counter substrate 250. A filler 293 (see FIG. 4) is filled between these substrates. The TFT substrate 220 includes pixels 280 arranged in a matrix in a display region 202. Each of the pixels 280 includes sub-pixels 282 to which four colors of R (Red), G (Green), B (Blue) and W (White) are respectively assigned. Besides, the TFT substrate 220 is provided with a drive IC (Integrated Circuit) 260 as a drive circuit which applies a potential for causing conduction between source and drain to a scanning signal line (not shown) of a pixel transistor arranged for each of the sub-pixels 282 and applies a voltage corresponding to a pixel gradation value to a data signal line of each pixel transistor. Besides, in this embodiment, each of the sub-pixels 282 includes an OLED (Organic Light Emitting Diode) to emit white light, and emits light having a wavelength region corresponding to each color by using a color filter corresponding to each color. However, as long as the system uses color filters, the organic EL display device may include OLEDs to emit lights of plural colors. In the pixels (main pixels) 280 each including four sub-pixels 282 of RGBW, the respective sub-pixels 282 are arranged so that four sub-pixels 282 sharing a corner part of the pixels 280 include a coupled color filter 285 (see FIG. 3) of color filters of the same color.

Figure 3:
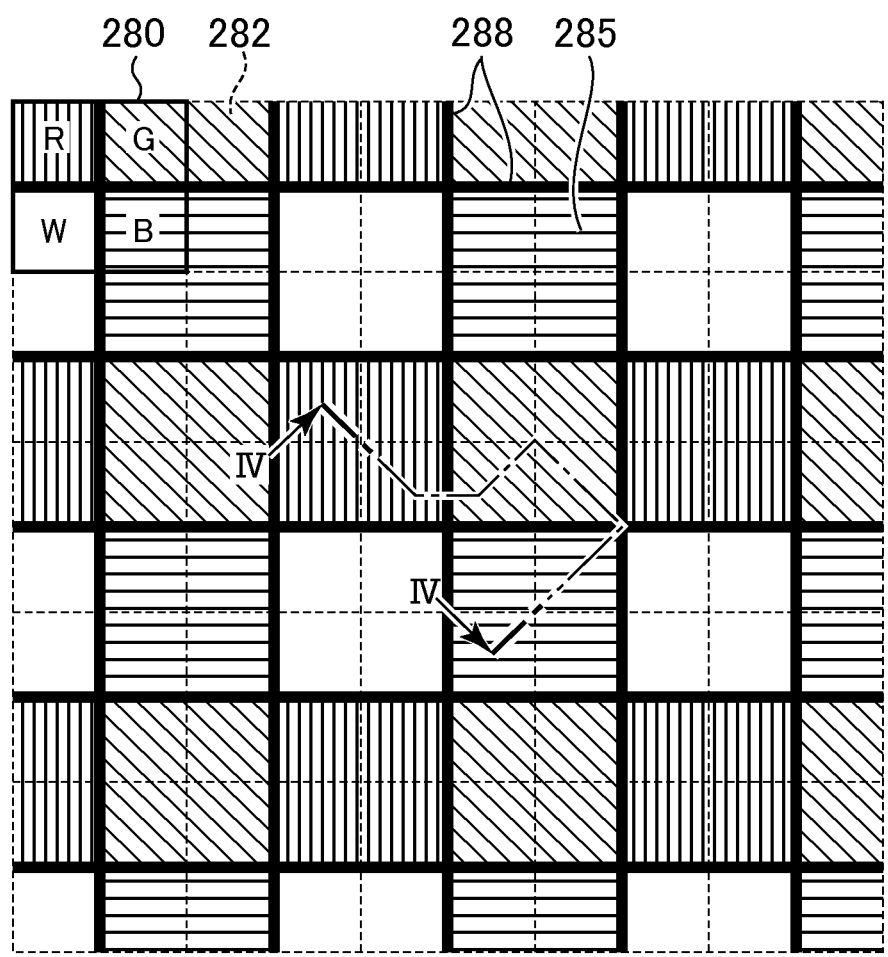
FIG. 3 is a view showing an arrangement of sub-pixels in a display region.

FIG. 3 is a view showing the arrangement of the sub-pixels 282 in the display region 202. As shown in this drawing, each of the pixels 280 includes the four sub-pixels 282 of RGBW, and the pixels are formed so that the four sub-pixels 282 sharing the corner part of the pixels 280 become the sub-pixels 282 of the same color (in other words, vertex parts of the four sub-pixels 282 are collected at a position of one lattice point of a rectangular lattice-shaped black matrix partitioning the respective main pixels 280, and the four sub-pixels 282 have the same color). Thus, the respective color filters of RGBW are the coupled color filters 285 integrally formed for every four sub-pixels 282. Further, in general, the black matrix 288 partitions the color filters for every sub-pixel 282, and shields light emitted from a portion near the boundary between the sub-pixels 282. However, in this embodiment, the black matrix is not formed on the boundary between the adjacent sub-pixels 282 of the same color (that is, the black matrix is not formed in the coupled color filter 285), but is formed only on the boundary between the color filters of different colors. Since the area where the black matrix 288 is formed can be reduced as described above, the numerical aperture is raised and the light-emitting efficiency can be raised. Incidentally, in this embodiment, the black matrix 288 is not formed on the boundary between the adjacent sub-pixels 282 of the same color. However, the black matrix 288 having a width smaller than the width of the black matrix 288 formed on the boundary between the sub-pixels 282 of different colors may be formed on the boundary between the sub-pixels 282 of the same color. Incidentally, a contact hole of each organic EL element may be formed in a region close to a center corner part of the four sub-pixels 282 where the color filters of the same color are integrally formed. Since the contact hole easily reflects light from the adjacent sub-pixels 282, when the contact hole is formed in the region close to the corner part where the adjacent sub-pixels 282 have the same color, lights of the same color are emitted and the color mixture can be suppressed.

Figure 4:
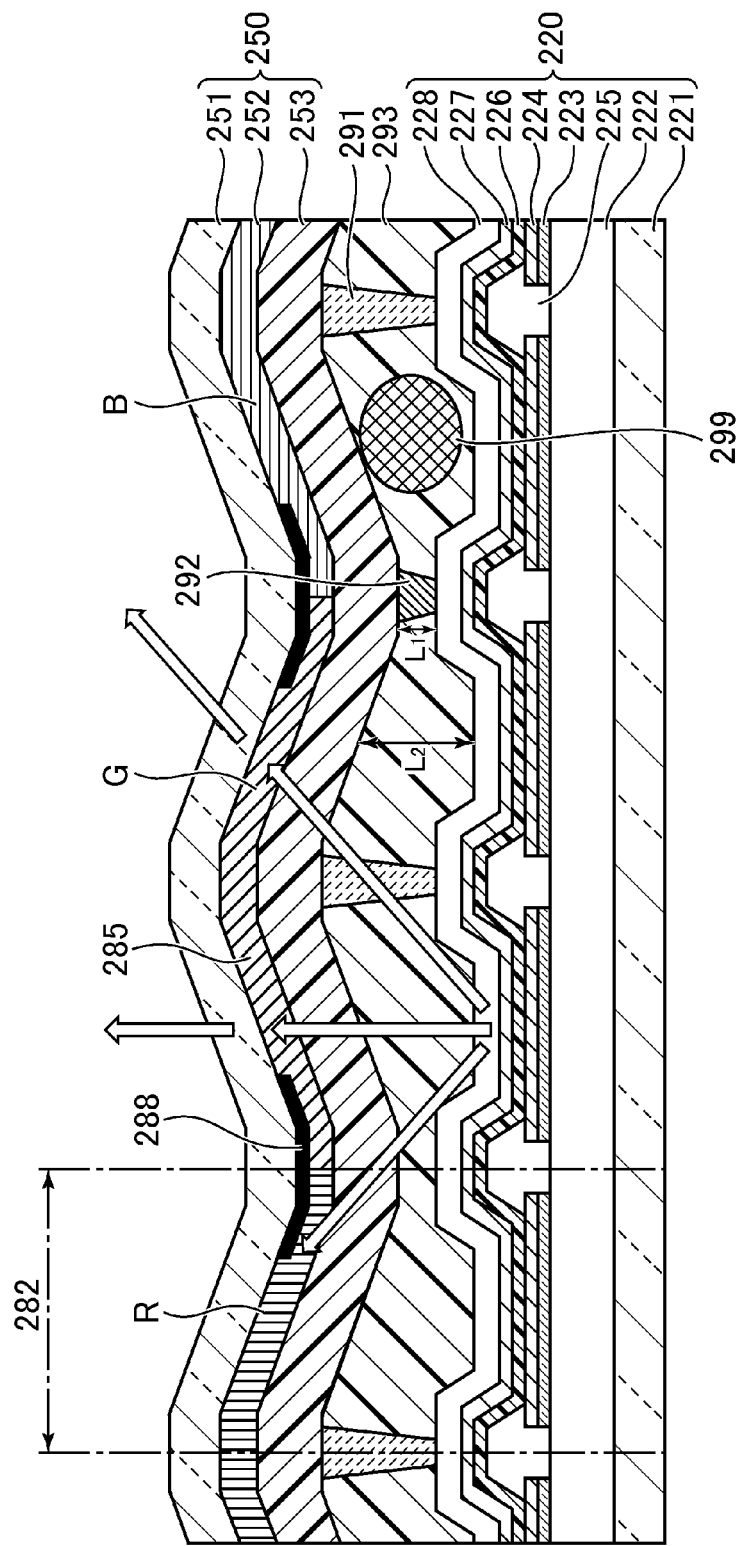
FIG. 4 is a view showing a section taken along line IV-IV of FIG. 3.

FIG. 4 is a view showing a section taken along line IV-IV of FIG. 3. As shown in this drawing, the TFT substrate 220 includes a transparent insulation substrate 221 made of glass or plastic, a transistor circuit layer 222 in which thin film transistors and wirings are formed, a reflection layer 223 to reflect a light traveling toward the insulation substrate 221 side in lights emitted from an after-mentioned light-emitting layer, a lower electrode 224 electrically connected to one electrode of the thin film transistor formed in the transistor circuit layer 222, a pixel separation film 225 covering an end of the lower electrode 224 and insulating the adjacent sub-pixels 282 from each other, a light-emitting organic layer 226 formed so as to cover the whole display region 202 on the lower electrode 224 and on the pixel separation film 225 and including the light-emitting layer to emit white light, an upper electrode 227 formed on the light-emitting organic layer 226 and made of a transparent electrode, and a sealing film 228 formed so as to cover the upper electrode 227.

Besides, the counter substrate 250 includes a transparent insulation substrate 251 made of glass or plastic, the black matrix 288 formed on the insulation substrate 251, a color filter layer 252 in which the coupled color filter 285 which is the color filter to allow light in each wavelength region of RGB to pass through is formed, and an overcoat layer 253 covering the color filter layer 252 and made of organic material.

The filler 293 made of transparent resin is filled between the TFT substrate 220 and the counter substrate 250, and fixes the TFT substrate 220 and the counter substrate 250 to each other. Here, columnar high spacers 291 and columnar low spacers 292, which are filler thickness adjustment parts, are discretely arranged in the filler 293, and adjust so that the thickness of the filler 293 varies according to a place. Here, a thickness L1 of the filler 293 in a region where the black matrix 288 as the light-shielding film is formed is thinner than a thickness L2 in a region where the light-emitting element is formed. Besides, for example, the height of the high spacer 291 can be made about 5 μm, and the height of the low spacer 292 can be made about 2 μm. Here, as the insulation substrate 251 used for the counter substrate 250, a low-rigidity plastic substrate, a film substrate, or a glass substrate of a thickness of 0.5 μm or less can be used.

Figure 5:
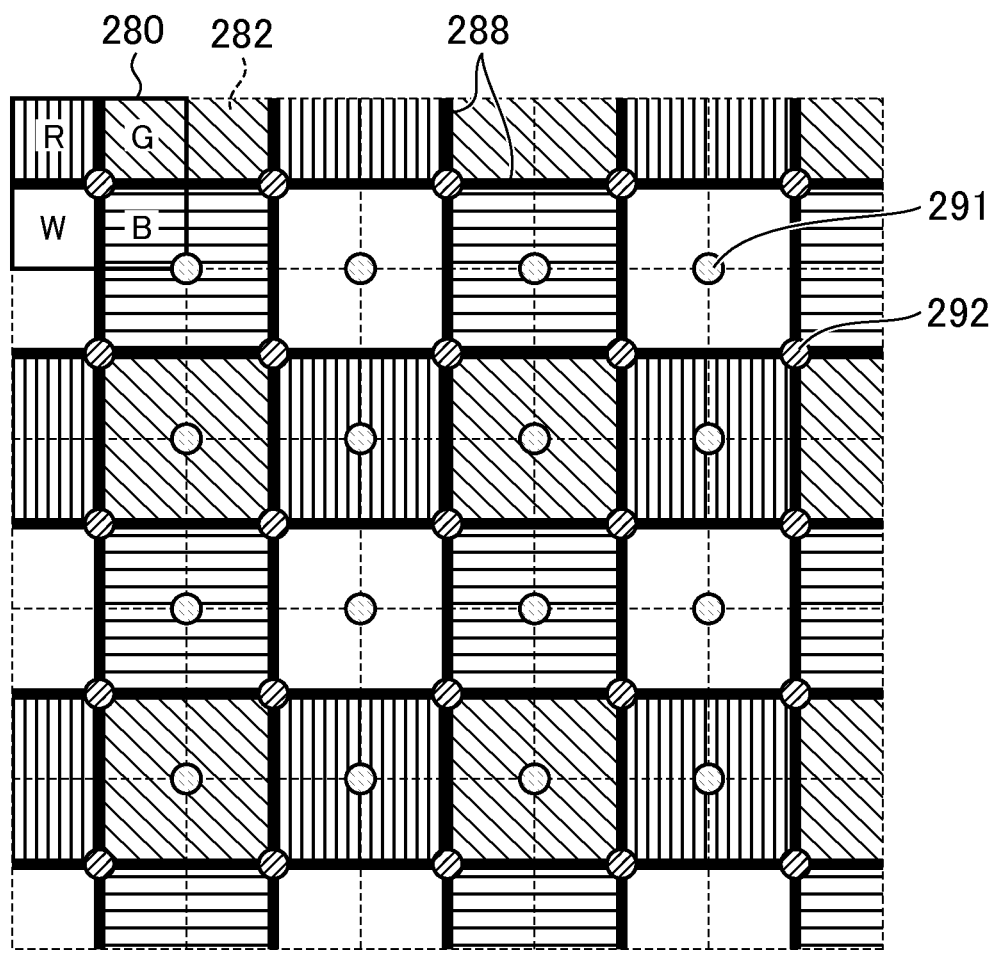
FIG. 5 is a view showing an arrangement of high spacers and low spacers.

FIG. 5 is a view showing the arrangement of the high spacers 291 and the low spacers 292 which are the filler thickness adjustment parts. As shown in this drawing, the high spacer 291 is arranged at a position where boundary lines of the four sub-pixels 282 of the same color intersect, and the low spacer 292 is arranged at a position where the black matrixes 288 intersect. As indicated by an arrow representing a light path in FIG. 4, the thickness of the filler 293 is formed to be thin by the low spacer 292, so that the black matrix 288 becomes close to the light-emitting layer, and light emission from the color filter of different color can be efficiently prevented. That is, the color mixture can be suppressed. On the other hand, the high spacer 291 allows lights from the adjacent sub-pixels 282 to be emitted. However, the high spacer is provided on the boundary between the sub-pixels 282 of the same color, lights of the same color are emitted, and the color mixture does not occur. Besides, when the TFT substrate 220 and the counter substrate 250 are bonded, there is a fear that a foreign substance 299 is taken in. However, since the region around the high spacer 291 where the thickness of the filler 293 is large is provided, the substrates can be bonded without damaging the light-emitting element. Accordingly, according to this embodiment, the area where the black matrix 288 is formed is reduced and deterioration of light-emitting efficiency is suppressed, while the optical color mixture can be suppressed. Besides, when the TFT substrate 220 and the counter substrate 250 are bonded, even if a foreign substance 299 intrudes, it can be held without damaging the light-emitting element. Besides, as shown in FIG. 4, since a structure having an irregular surface is obtained, reflected light of external light can be scattered, and deterioration of visibility due to the reflection of external light can be suppressed.

Figure 6:
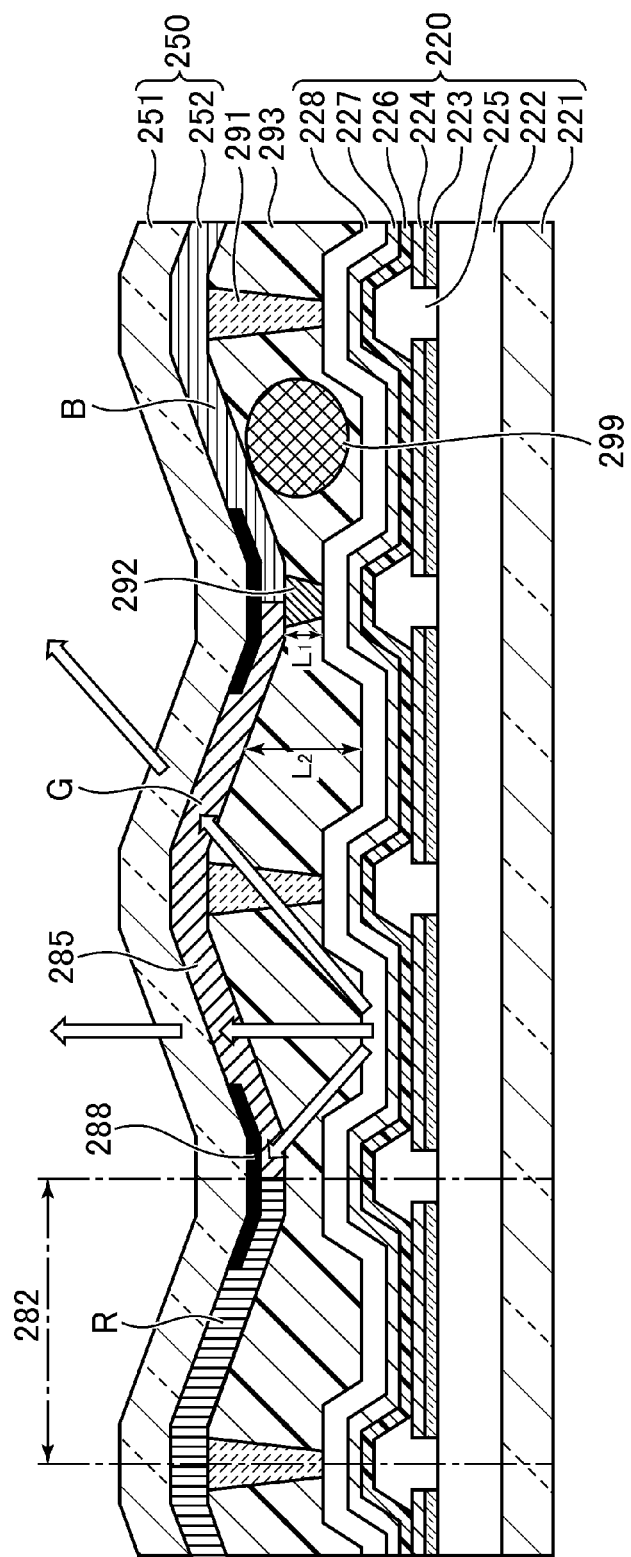
FIG. 6 is a view showing a first modified example in the same visual field as the section of FIG. 4.

FIG. 6 is a view showing a first modified example in the same visual field as the section of FIG. 4. A point different from the section of FIG. 4 is that the overcoat layer 253 is not provided, and the others are the same as the structure in FIG. 4. When the overcoat layer 253 is not provided, since a black matrix 288 can be made closer to a TFT substrate 220, the color mixture can be more suppressed.

Figure 7:
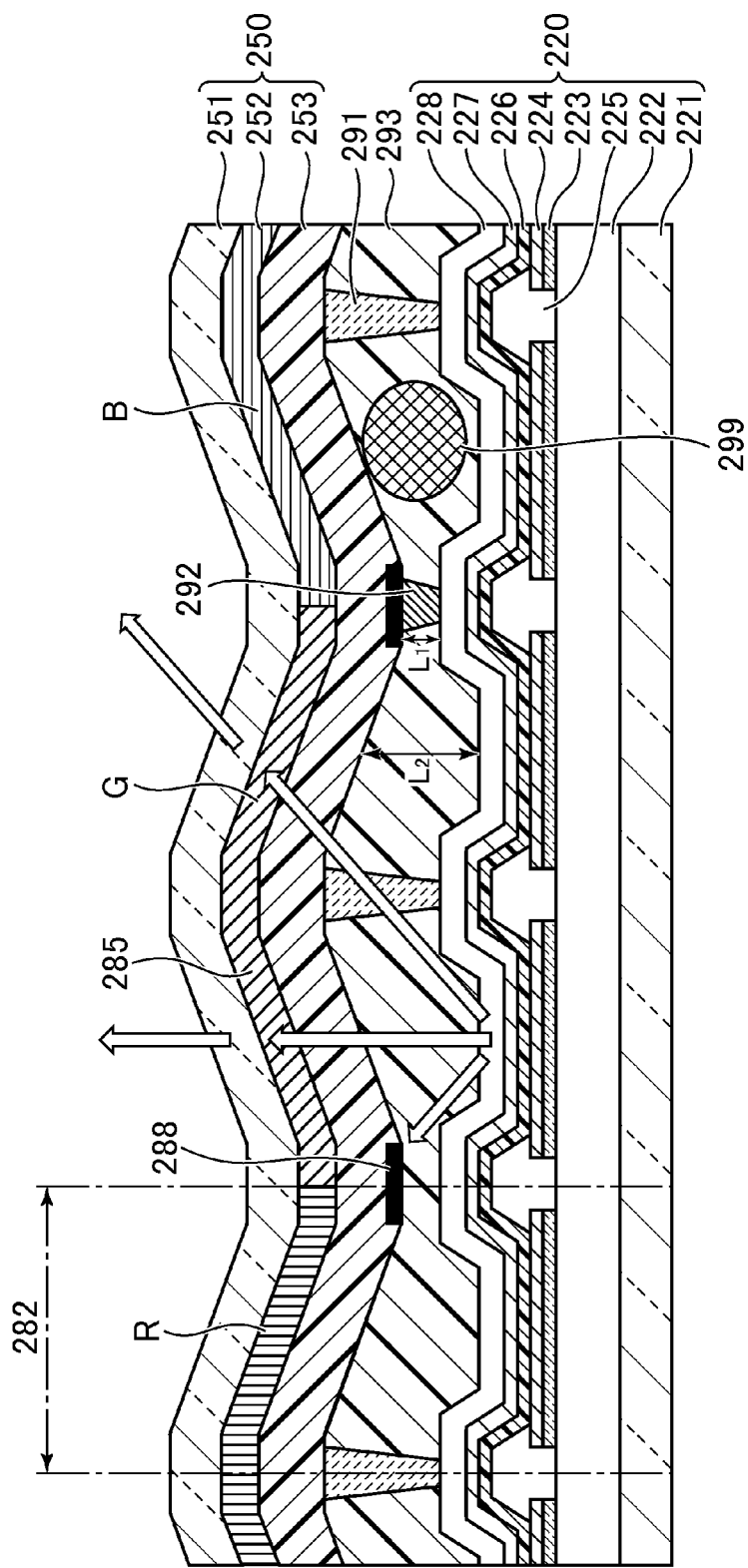
FIG. 7 is a view showing a second modified example in the same visual field as the section of FIG. 4.

FIG. 7 is a view showing a second modified example in the same visual field as the section of FIG. 4. A point different from the section of FIG. 4 is that a black matrix 288 is formed on an overcoat layer 253, that is, on the side closest to a TFT substrate 220, and the others are the same as the structure in FIG. 4. Since the black matrix 288 can be made closer to the TFT substrate 220 by forming the black matrix 288 on the overcoat layer 253, the color mixture can be more suppressed.

Figure 8:
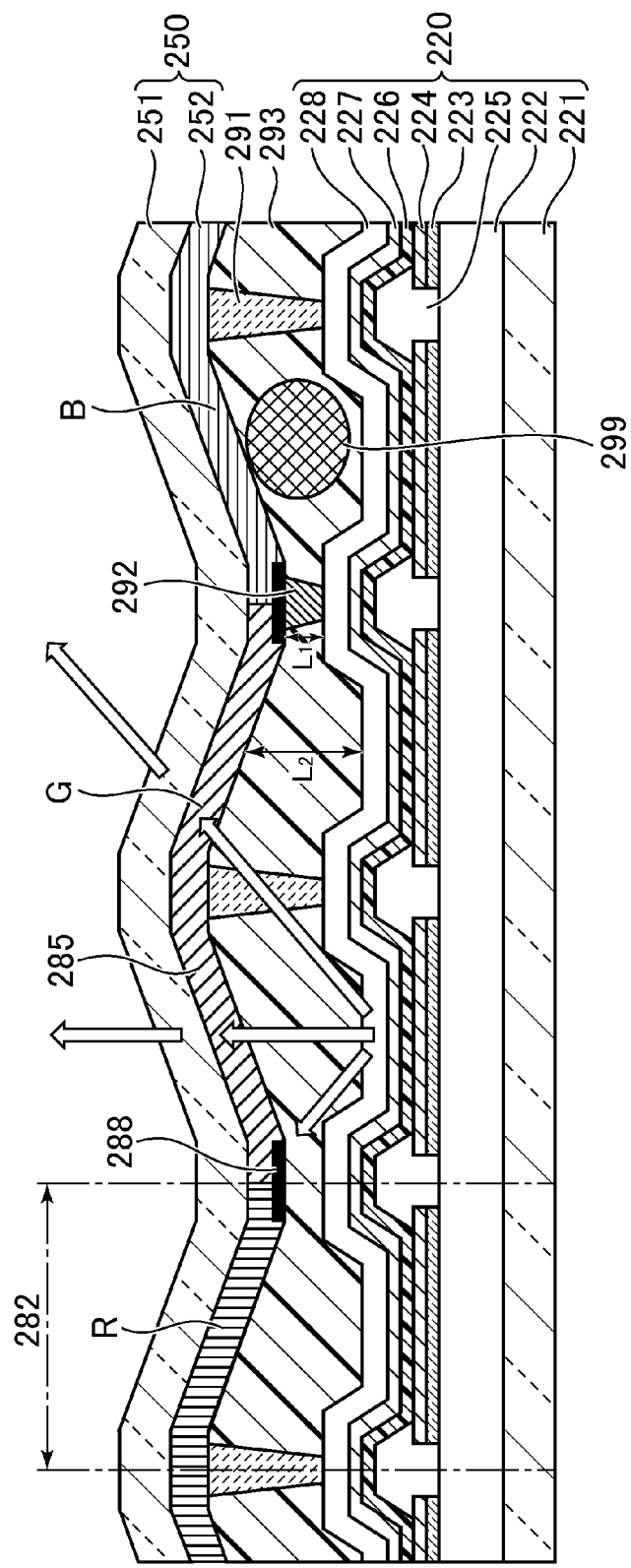
FIG. 8 is a view showing a third modified example in the same visual field as the section of FIG. 4.

FIG. 8 is a view showing a third modified example in the same visual field as the section of FIG. 4. A point different from the section of FIG. 4 is that the overcoat layer 253 is not provided, and a black matrix 288 is formed on a color filter layer 252. The others are the same as the structure in FIG. 4. The overcoat layer 253 is not provided and the black matrix 288 is formed on the color filter layer 252, so that the black matrix 288 can be made closer to a TFT substrate 220, and accordingly, the color mixture can be more suppressed.

Figure 9:
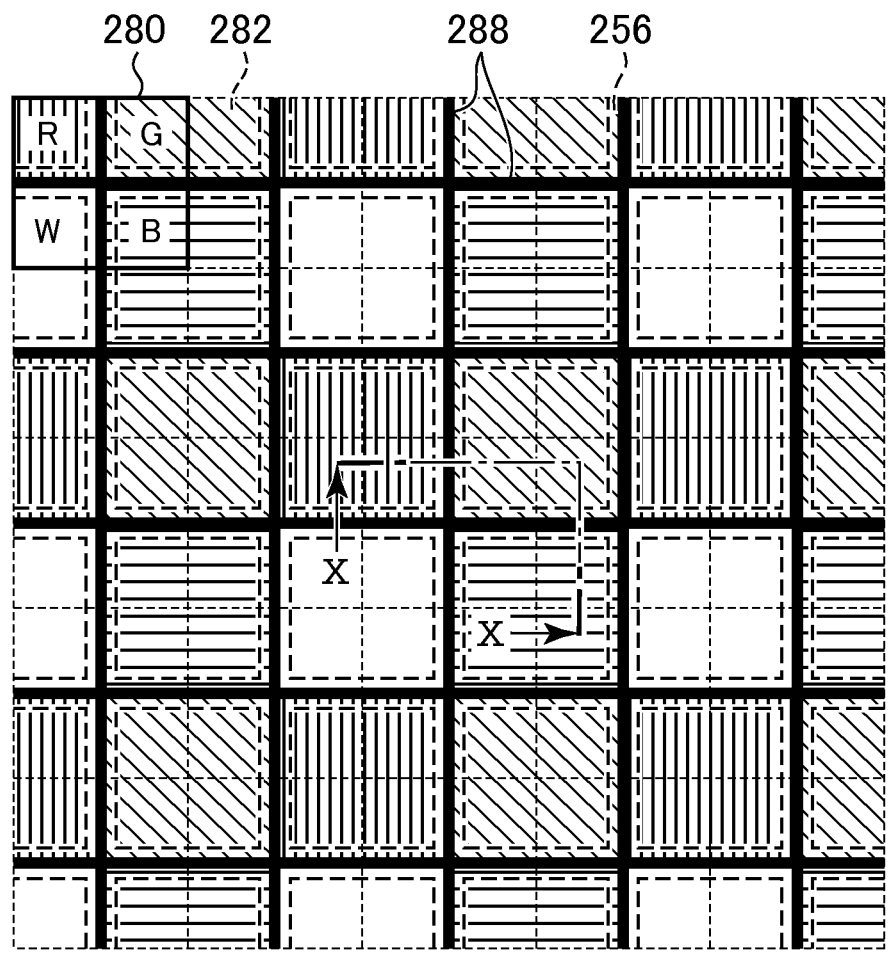
FIG. 9 is a view showing an arrangement of sub-pixels in a display region of an organic EL display device of a fourth modified example.

FIG. 9 is a view showing an arrangement of sub-pixels 282 in a display region 202 of an organic EL display device of a fourth modified example. In this drawing, the structure of a pixel 280 and the sub-pixel 282 and the arrangement of a black matrix 288 are the same as those of FIG. 3. In this modified example, a projection 256 as a filler thickness adjustment part is formed along a boundary between color filters of different colors.

Figure 10:
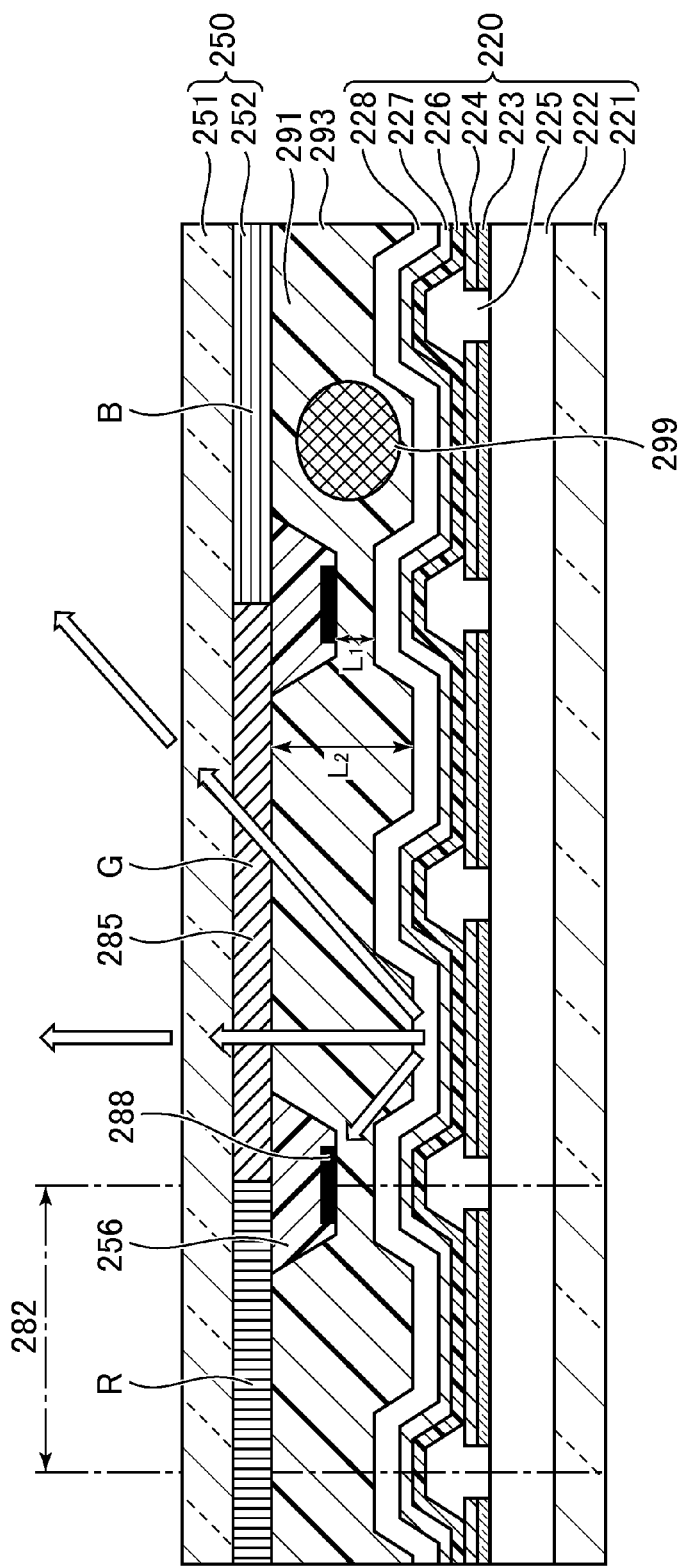
FIG. 10 is a view showing a section taken along line X-X of FIG. 9.

FIG. 10 is a view showing a section taken along line X-X of FIG. 9. As shown in this drawing, in the fourth modified example, a TFT substrate 220 and a counter substrate 250 are arranged substantially in parallel to each other. In the counter substrate 250, the projection 256 is formed along the boundary between the color filters of different colors on a color filter layer 252. Further, the black matrix 288 is formed on the projection 256. Since the structure of the TFT substrate 220 is the same as that of FIG. 4, the description thereof is omitted. Here, a thickness L1 of a filler 293 in a region where the black matrix 288 as the light-shielding film is formed is thinner than a thickness L2 in a region where a light-emitting element is formed. The projection 256 may be formed of the same material as the overcoat layer 253 of FIG. 4, and its height can be made, for example, about 2 μm.

By the structure as stated above, the thickness of the filler 293 at the boundary between the color filters of different colors can be made thin, the black matrix 288 is formed to be close to the TFT substrate 220, and light emission from the adjacent color filter of different color can be prevented. Thus, the color mixture can be suppressed. Here, although the thickness of the filler 293 is adjusted by the amount of the filler 293, the thickness may be adjusted by spacers similarly to the above embodiment. Besides, since the projection 256 is not formed on a boundary between the adjacent sub-pixels 282 including color filters of the same color, that is, in a region of a coupled color filter 285, light emission from the adjacent sub-pixels 282 is allowed. However, since the lights of the same color are emitted, the color mixture does not occur. Further, when the TFT substrate 220 and the counter substrate 250 are bonded, there is a fear that a foreign substance 299 is taken in. However, the foreign substance 299 is taken in the region where the thickness of the filler 293 is large, and the substrates can be bonded without damaging the organic EL element. Accordingly, according to this embodiment, the area where the black matrix 288 is formed is reduced, and deterioration of the light-emitting efficiency is suppressed, while the optical color mixture can be suppressed. Besides, when the TFT substrate 220 and the counter substrate 250 are bonded, even if the foreign substance 299 intrudes, the filler 293 can be kept without damaging the light-emitting element.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic EL display device comprising:
    a thin film transistor substrate in which a light-emitting element is provided for each of a plurality of sub-pixels constituting each pixel on a transparent insulation substrate;
    a counter substrate provided with, on a transparent insulation substrate, a color filter layer comprising color filters, some of the color filters constituting a coupled color filter which is a color filter arranged to be extended over adjacent two or more of the sub-pixels and allowing light in one wavelength region to pass through, the counter substrate further provided with a light-shielding film which is arranged on a boundary between adjacent two of the color filters to allow lights in different wavelength regions to pass through and shields light;
    a filler arranged between the thin film transistor substrate and the counter substrate and made of a transparent organic material; and
    a filler thickness adjustment part which adjusts to cause a thickness of the filler in a region where the light-shielding film is provided to be thinner than a thickness of the filler in a region where the light-emitting element is provided,
    wherein the color filter layer has a first portion where the light-shielding film overlaps with the color filters and a second portion where the light-shielding film does not overlap with the color filters, and the first portion is closer to the light-emitting element than the second portion.

2. The organic EL display device according to claim 1, wherein the filler thickness adjustment part is a columnar spacer arranged in the filler.

3. The organic EL display device according to claim 1, wherein the filler thickness adjustment part is a film provided on the counter substrate and provided on the boundary between the adjacent two of the color filters to allow the lights in the different wavelength regions.

4. The organic EL display device according to claim 1, wherein the coupled color filter is provided over four of the sub-pixels sharing one corner part.

5. The organic EL display device according to claim 1, wherein the sub-pixel emits light of one of R (Red), G (Green), B (Blue) and W (White) and four sub-pixels to emit lights of R (Red), G (Green), B (Blue) and W (White) constitute one pixel.

6. The organic EL display device according to claim 1, wherein the first portion has uniformity in thickness which is equal to a thickness of the second portion.

* * * * *